United States Patent
Shih et al.

(10) Patent No.: US 8,952,329 B1
(45) Date of Patent: Feb. 10, 2015

(54) 3D IMAGE PROFILING TECHNIQUES FOR LITHOGRAPHY

(71) Applicant: Taiwan Semiconductor Manufacturing Co., Ltd., Hsin-Chu (TW)

(72) Inventors: I-Chang Shih, Zhubei (TW); Yi-Jie Chen, Hsinchu (TW); Chia-Cheng Chang, Zhubei (TW); Feng-Yuan Chiu, Zhudong Township (TW); Ying-Chou Cheng, Zhubei (TW); Chiu Hsiu Chen, Zhubei (TW); Bing-Syun Yeh, Hsinchu (TW); Ru-Gun Liu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/045,138

(22) Filed: Oct. 3, 2013

(51) Int. Cl.
*G01N 23/00* (2006.01)
*G21K 7/00* (2006.01)
*G01B 15/04* (2006.01)

(52) U.S. Cl.
CPC .................................. *G01B 15/04* (2013.01)
USPC .... 250/307; 250/310; 250/492.1; 250/492.21

(58) Field of Classification Search
USPC .......................... 250/307, 310, 492.1, 492.21
See application file for complete search history.

(56) References Cited

U.S. PATENT DOCUMENTS

2002/0156594 A1 * 10/2002 Houge et al. .................. 702/127
2009/0182528 A1 * 7/2009 De Groot et al. ............. 702/167

* cited by examiner

*Primary Examiner* — Nikita Wells
*Assistant Examiner* — Meenakshi Sahu
(74) *Attorney, Agent, or Firm* — Eschweiler & Associates, LLC

(57) ABSTRACT

A method for characterizing a three-dimensional surface profile of a semiconductor workpiece is provided. In this method, the three-dimensional surface profile is imaged from a normal angle to measure widths of various surfaces in a first image. The three-dimensional surface is also imaged from a first oblique angle to re-measure the widths of the various surfaces in a second image. Based on differences in widths of corresponding surfaces for first and second images, a feature height and sidewall angle are determined for the three-dimensional profile.

19 Claims, 7 Drawing Sheets

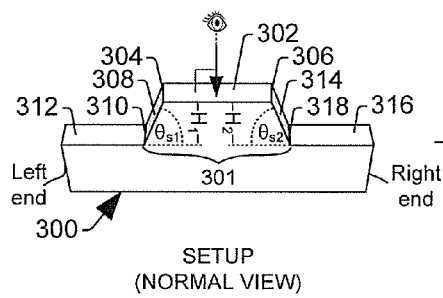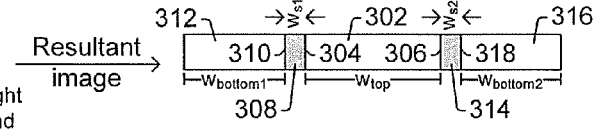
FIG. 3A SETUP (NORMAL VIEW)  FIG. 3B FIRST IMAGE (NORMAL VIEW)
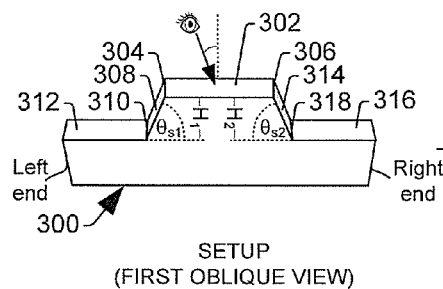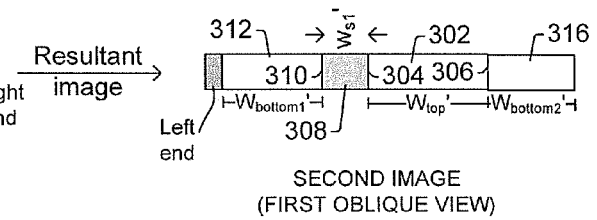
FIG. 4A SETUP (FIRST OBLIQUE VIEW)  FIG. 4B SECOND IMAGE (FIRST OBLIQUE VIEW)
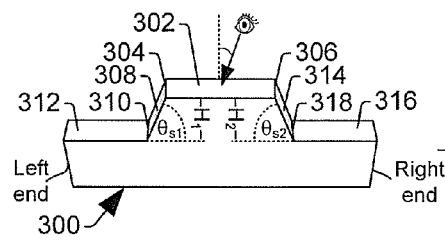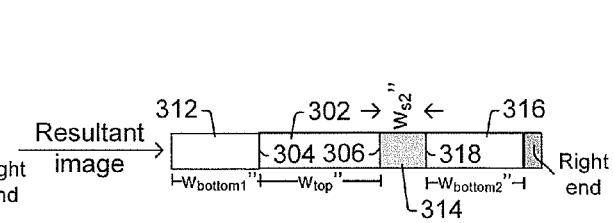
FIG. 5A SETUP (SECOND OBLIQUE VIEW)  FIG. 5B THIRD IMAGE (SECOND OBLIQUE VIEW)

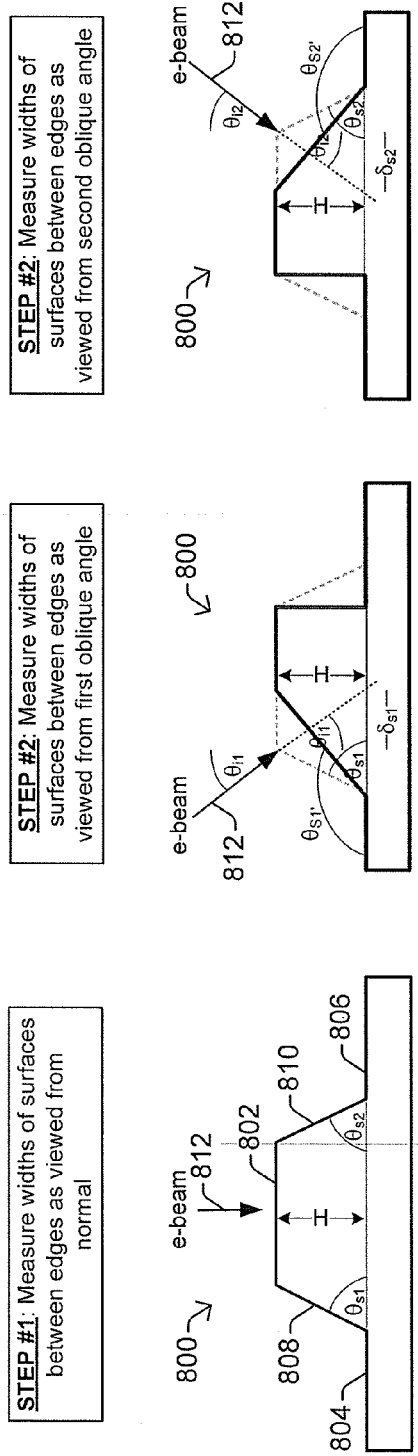
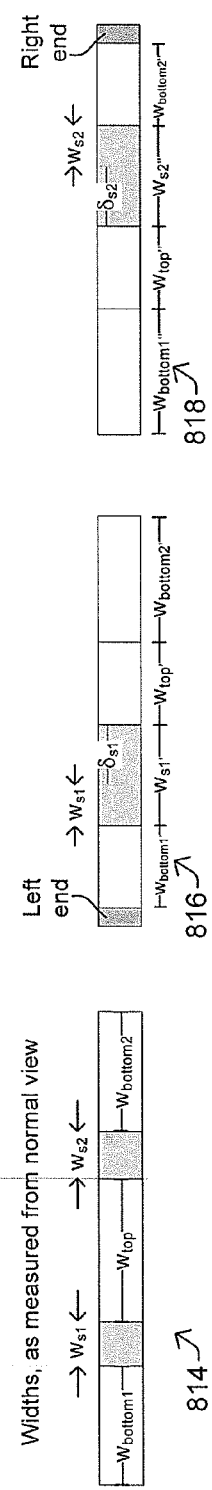
FIG. 8A
FIG. 8B
FIG. 8C

3D IMAGE PROFILING TECHNIQUES FOR LITHOGRAPHY

BACKGROUND

Photolithography, which may be termed optical lithography or ultra-violet (UV) lithography in some contexts, is a process used to pattern extremely small features on an integrated circuit (IC). It uses light to transfer a geometric pattern from a photomask to a light-sensitive chemical "photoresist", or simply "resist," on the IC being manufactured. A series of chemical treatments then either engraves the geometric pattern into the material under the photoresist, or enables deposition of a new material in the desired pattern upon the material underneath the photo resist. In complex ICs, a wafer will go through photolithography a large number of times to buildup successive patterned layers that make up the resultant IC.

BRIEF DESCRIPTION OF THE DRAWINGS

FIGS. 3A-3B, 4A-4B, and 5A-5B show some example illustrations of how FIG. 2's method can be carried out.

FIGS. 8A-8C show some example illustrations of how FIG. 7's method can be carried out.

DETAILED DESCRIPTION

Figure 1:
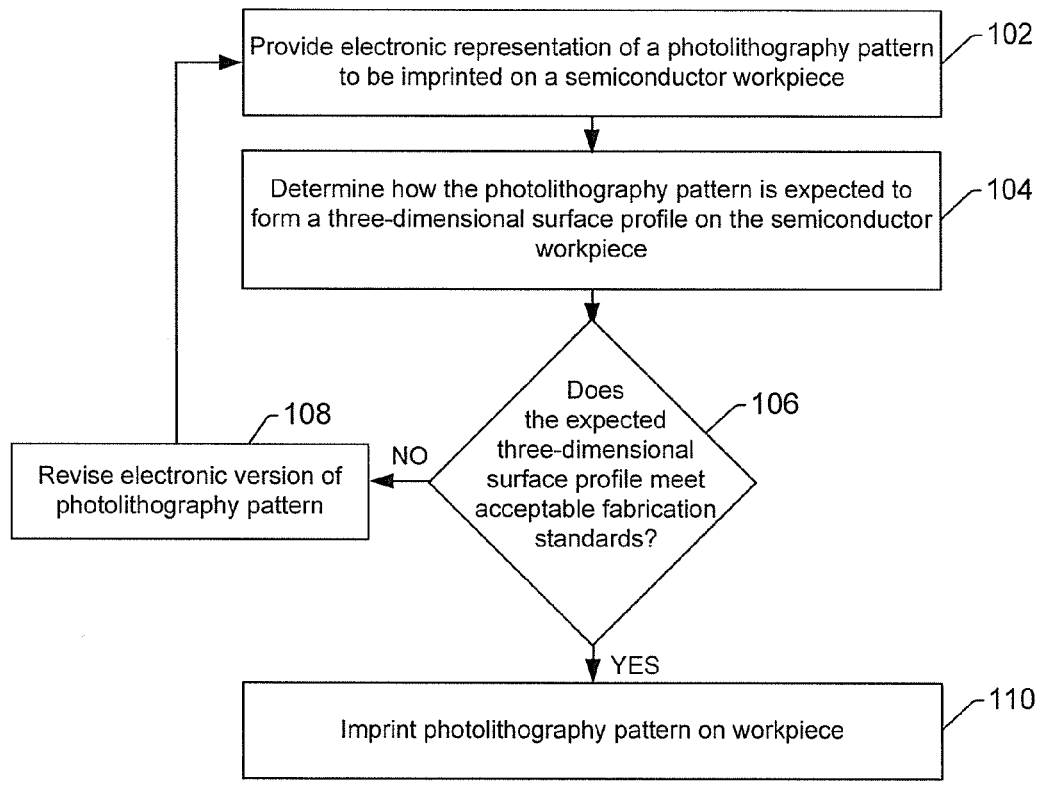
FIG. 1 shows a design flow that makes use of a highly accurate lithography process model.

One or more implementations of the present invention will now be described with reference to the attached drawings, wherein like reference numerals are used to refer to like elements throughout. The drawings are not drawn to scale.

Aspects of the present disclosure are aimed at providing a more accurate lithography process model, which accounts for minute variations in photolithography patterns that may be encountered during the manufacturing process. This model is then used to simulate the various layers expected to be formed though photolithography, along with statistical variations in the various layers, to predict whether a given photolithography pattern will be printed correctly in a real-world manufacturing environment.

FIG. 1 shows an example of a design flow 100 that makes use of a highly accurate lithography process model. The design flow 100 starts at 102 when an electronic representation of a photolithography pattern, which is to be imprinted on a semiconductor workpiece, is provided. At 104, the method determines through simulation how the photolithography pattern is expected to form a three-dimensional surface profile on a semiconductor workpiece. In 106, based on the simulation, the method determines whether the expected three dimensional surface profile corresponding to the photolithography pattern is expected to meet acceptable fabrication standards when imprinted. If the design is not expected to meet acceptable fabrication standards when imprinted (NO at 106), the method proceeds to 108 where the electronic photolithography pattern is revised, after which the revised pattern is subsequently re-checked in blocks 102-106. When the final electronic representation of the photolithography pattern is expected to be in conformance with acceptable fabrication standards (YES at 108), the method proceeds to 110, and the lithography pattern can be formed on one or more masks or reticles that will be used to imprint the desired pattern onto actual wafers during manufacturing.

To help ensure that the design flow 100 accurately models real world conditions at a sufficient level of detail, in block 104, the three-dimensional surface profile is tuned to account for minute variations in photolithography patterns that may be encountered during the manufacturing process. For example, the three-dimensional surface profile can include detailed topographical information, including feature heights and sidewall angles of surface features and even topographical imperfections such as imperfections in photoresist (e.g., photoresist scum buildup near edges of raised or sunken features on the wafer). This three-dimensional surface profile can thus model the formation of various patterned layers expected to be formed though photolithography, along with statistical variations in the various layers over process corners, to predict whether a given photolithography pattern will be printed correctly in a real-world manufacturing environment.

Figure 2:
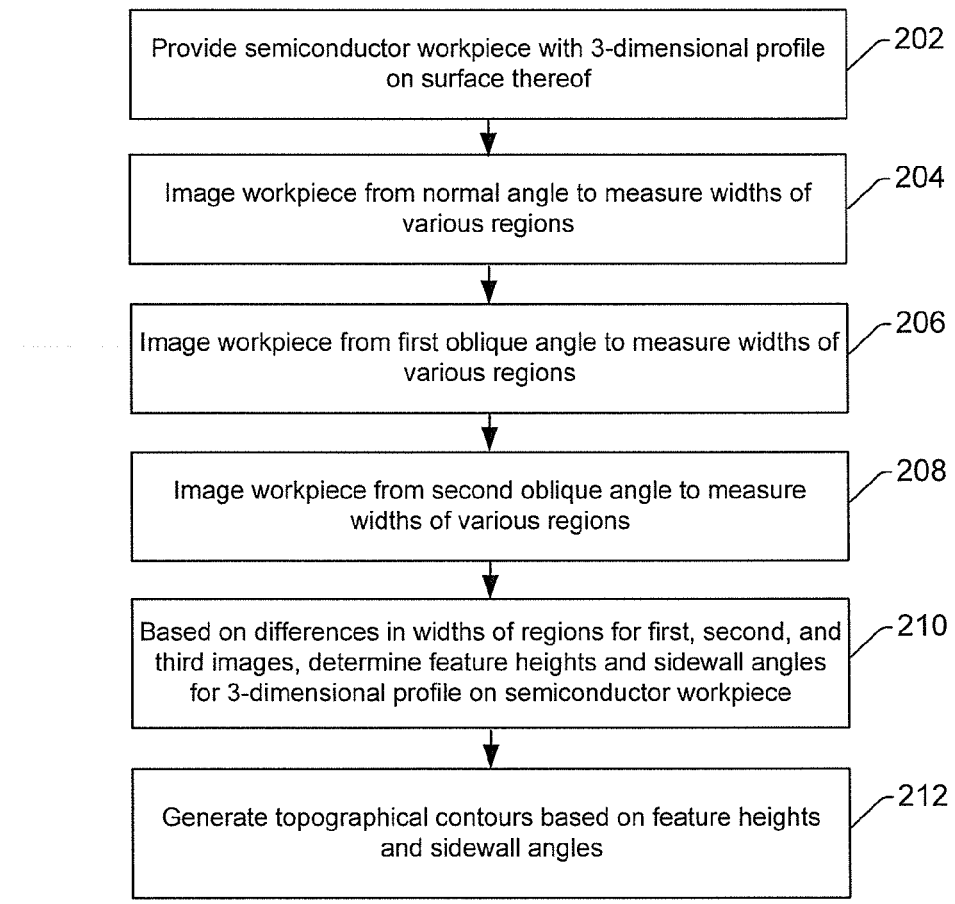
FIG. 2 illustrates a three-dimensional profiling method in flowchart format.
Figure 7:
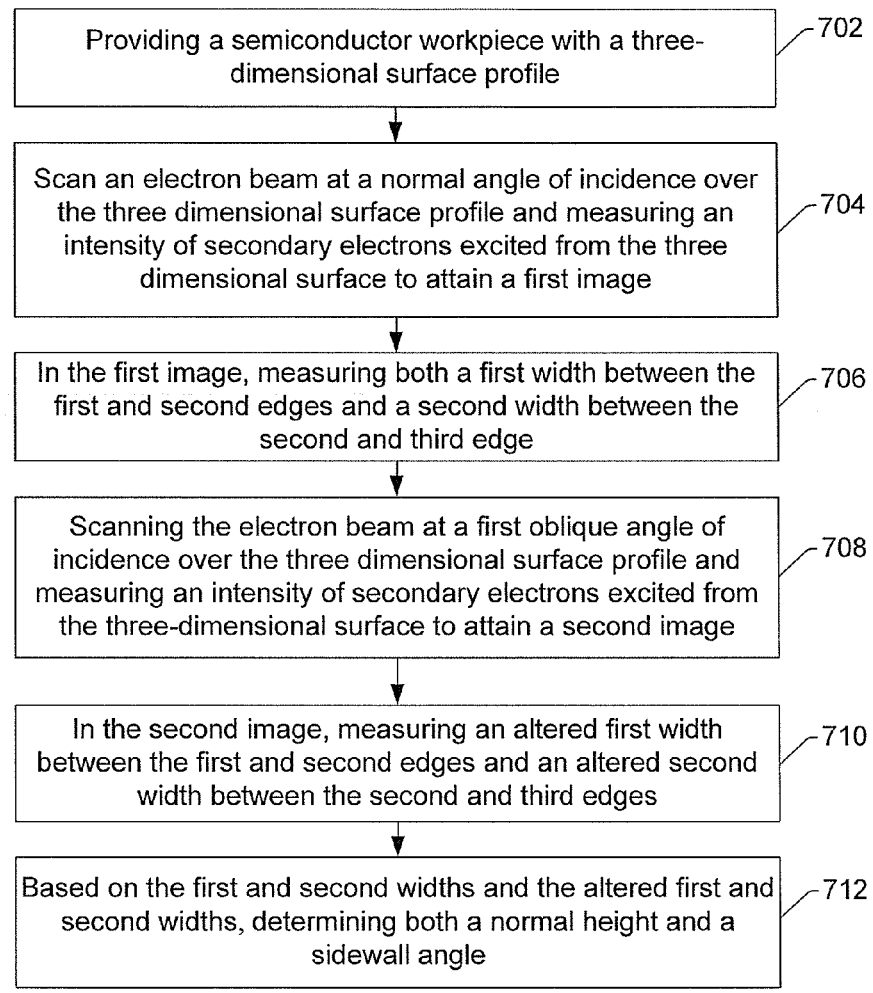
FIG. 7 shows a more particular three-dimensional profiling method that uses scanning electron microscopy (SEM) techniques.

To set forth some embodiments of how such a three-dimensional surface profile can be determined, FIG. 2 illustrates a somewhat general 3D-profiling method 200 in flowchart format and FIGS. 3A-5B show some example illustrations of how FIG. 2's method can be carried out. Further, FIG. 7 shows a more particular three-dimensional profiling method 700 that uses scanning electron microscopy (SEM) techniques, and FIGS. 8A-8C show some example illustrations of how FIG. 7's method can be carried out. It will be appreciated that although these methods each illustrate a number of acts, not all of these acts are necessarily required, and other unillustrated acts may also be present. Also, the ordering of the acts in some embodiments can vary from what is illustrated in these figures. In addition, the illustrated acts can be further divided into sub-acts in some implementations, while in other implementations some of the illustrated acts can be carried out concurrently with one another.

FIG. 2's method 200 starts at 202 when a semiconductor workpiece with a three-dimensional profile on a surface thereof is provided. At 204, the workpiece is imaged from a normal angle, and widths of various surface regions are measured. At 206, the workpiece is imaged from a first oblique angle to re-measure the widths of various regions as viewed from the first oblique angle. At 208, the workpiece is imaged from a second oblique angle to re-measure the widths of the various regions as viewed from the second oblique angle. At 210, based on differences in widths of regions for first, second, and third images, the method 200 determines feature heights and sidewall angles for the three-dimensional surface profile on the semiconductor workpiece.

Turning now to FIGS. 3A-3B, 4A-4B, and 5A-5B, one can see a series of illustrations that collectively depict a method of measuring a three-dimensional surface profile that is consistent with FIG. 2's methodology. It will be appreciated that nothing in these figures is limiting, and that these illustrations are provided merely as an example to help the reader's understanding.

FIG. 3A shows a perspective view of substrate 300 having a three-dimensional surface profile with a "table-like" feature 301 thereon. The table-like feature 301 has a substantially planar upper surface 302 having first and second edges 304, 306. A first angled sidewall, 308, which meets the planar upper surface 302 at the first edge 304, includes a third edge 310. The first angled sidewall 308 meets first lower surface 312 at third edge 310. The first sidewall 308 is angled at a first to-be-determined angle, $\theta_{s1}$, of other than ninety degrees. The first sidewall 308 has a first normal height, $H_1$, as measured between the first and third edges 304, 310.

A second angled sidewall, 314, which meets the planar surface 302 at the second edge 306, extends downwardly to meet second lower surface 316 at a fourth edge 318. The second sidewall 314 is angled at a second to-be-determined angle, $\theta_{s2}$, of other than ninety degrees. The second sidewall 314 has a second normal height, H2, as measured between the second and fourth edges 306, 318. The second to-be-determined angle, $\theta_{s2}$, can be the same or different from the first to-be-determined angle, $\theta_{s1}$. Although the first normal height, $H_1$, is illustrated as being equal to the second normal height, $H_2$, the first and second normal heights, $H_1$, $H_2$, can also be different from one another.

As shown in FIG. 3A, the three dimensional surface profile 300 is imaged from a normal angle (i.e., perpendicular to the upper surface 302), thereby producing a first image as shown in FIG. 3B. As can be seen from FIG. 3B, a width of the top surface 302, $w_{top}$, can be measured between the first and second edges 304, 306 in the first image. Similarly, a first sidewall width, $w_{s1}$, can be measured between the first and third edges 304, 310; and a second sidewall width, $w_{s2}$, can be measured between the second and fourth edges 306, 318.

As shown in FIG. 4A, the three dimensional surface profile is then imaged from a first oblique angle (e.g., +30 degrees from normal), thereby producing a second image as shown in FIG. 4B. The method re-measures width of top surface width, $w_{top}'$ (e.g., between first and second edges) and width of first sidewall $w_{s1'}$. Compared to first image of FIG. 3B, the three-dimensional profile of FIG. 4B includes altered widths $w_{bottom1'}$, $w_{top'}$, and $w_{bottom2'}$, each of which is slightly smaller than measured in FIG. 3B's image. $W_{s1'}$ is enlarged in FIG. 4B's image, and $w_{s2}$ disappears from view, relative to FIG. 3B's image.

As shown in FIG. 5A, the three dimensional surface profile is then imaged from a second oblique angle (e.g., −30 degrees from normal), thereby producing a third image as shown in FIG. 5B. The method re-measures width of top surface width, $w_{top}''$ (e.g., between first and second edges); and a second sidewall width, $w_{s2''}$. Compared to first image of FIG. 3B, the three-dimensional profile of FIG. 5B includes altered widths $w_{bottom1''}$, $W_{top''}$, and $w_{bottom2''}$, each of which is slightly smaller than measured in FIG. 3B's image. $W_{s2''}$ is enlarged in FIG. 5B's image, and $w_{s1}$ disappears from view, relative to FIG. 3B's image.

As will be appreciated in more detail further herein, by evaluating the changes in the widths (e.g., from $w_{s1}$ to $w_{s1}'$ and from $w_{s2}$ to $w_{s2}''$) in view of the change in angle of incidence, the normal feature heights $H_1$, $H_2$ and sidewall angles $\theta_{s1}$, $f_{s2}$ can also be determined. Notably, accurate determinations of these feature heights and sidewall angles allows much more accurate three-dimensional surface profiles to be determined, relative to conventional techniques, thereby providing more accurate lithographic patterning models.

Figure 6A:
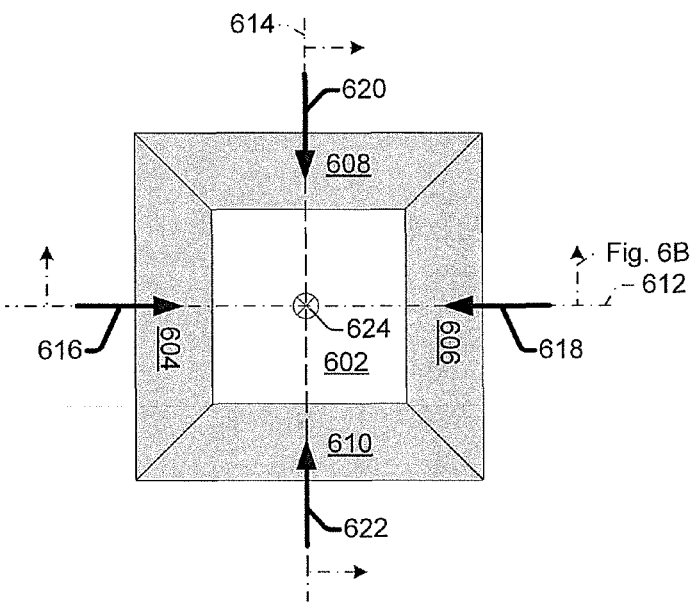
FIG. 6A shows a top view of a three dimensional surface profile with various imaging operations taking place thereon.
Figure 6B:
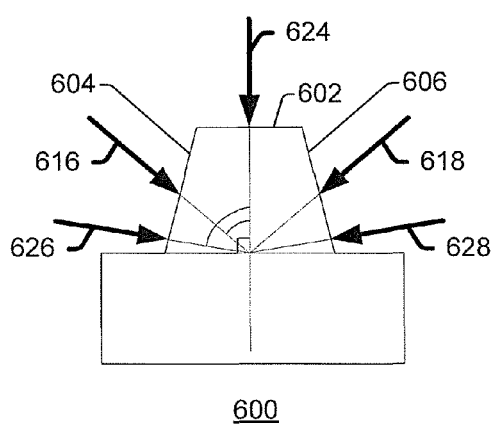
FIGS. 6B-6C show cross-sectional views of the three dimensional surface profile of FIG. 6A along the cut-away lines as indicated.
Figure 6C:
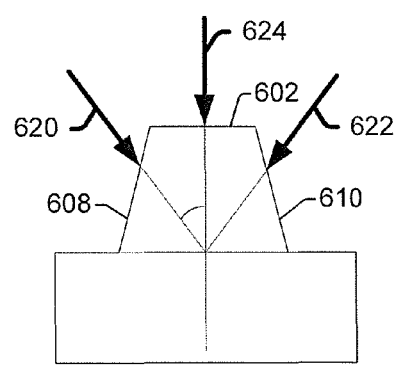

For further clarity, FIGS. 6A-6C collectively show another feature on a workpiece 600, wherein FIG. 6A shows a top view the workpiece 600 and FIGS. 6B-6C show cross-sectional views. An upper surface 602 and two pairs of opposing sidewalls (i.e., a first pair including first and second sidewalls 604, 606 and a second pair including third and fourth sidewalls 608, 610) are included on the workpiece 600. Compared to FIGS. 3-5, which showed imaging operations only along a single axis (e.g., axis extending along plane of the page), FIGS. 6A-6C show imaging operations being performed on at least two axes 612, 614. This allows additional sidewall heights and sidewall angles to be measured which were not measured in FIGS. 3-5.

More particularly, along the first axis 612, a first oblique imaging operation 616 is performed to produce a first image, and a second oblique imaging operation is performed to produce a second image. Along the second axis 614, a third oblique imaging operation 620 is performed to produce a third image, and a fourth oblique imaging operation 622 is performed to produce a fourth image. A normal imaging operation 624 is also performed to produce a fifth image. The widths contained in the first and second images (e.g., oblique images taken on the first axis 612) can evaluated in light of the widths contained in the fifth image (e.g., normal image) to discern the normal heights and sidewall angles of the first and second sidewalls 604, 606; while the widths contained in the third and fourth images (e.g., oblique images taken on the second axis 614) can evaluated in light of the widths contained in the fifth image (e.g., normal image) to discern the normal heights and sidewall angles of the third and fourth sidewalls 608, 610. Additional measurements along other axes (e.g., 45°, 60°, etc.—not shown) could also be taken. Further, if greater measurement precision is desired, rather than a single imaging operation being performed from a given direction, multiple imaging operations from each direction can be performed, such as shown by arrows (616 and 626 or 618 and 628) in FIG. 6B. In some instances, the various imaging operations can be at the same angle of incidence, albeit reflected about the normal angle, while in other embodiments the various imaging operations can be taken at different angles of incidence without being reflected about normal angle relative to another imaging operation.

Turning now to FIG. 7, one can see a more particular three-dimensional profiling method 700 that uses scanning electron microscopy (SEM) techniques. At 702, a semiconductor workpiece with a three dimensional surface profile is provided. At 704, an electron beam is scanned over the three dimensional surface profile at a constant normal angle, and an intensity of secondary electrons excited by the electron beam from the three dimensional surface is measured to attain a first image. At 706, in the first image, a first width is measured between first and second edges defining an upper surface, and a second width is measured between the second edge and a third edge defining a sidewall surface. At 708, the electron beam is scanned at a first oblique angle of incidence over the three dimensional surface profile, and an intensity of secondary electrons excited from the three-dimensional surface is measured to attain a second image. At 710, in the second image, an altered first width between the first and second edges and an altered second width between the second and third edges is measured. In 712, based on the first and second widths and the altered first and second widths, the method determines both a normal height and a sidewall angle.

FIGS. 8A-8C show more particular three-dimensional surface profiling techniques. Again, for purposes of illustration, a table-like feature 800 is illustrated, which has an upper surface 802, first and second lower surfaces 804, 806, and first and second angled sidewalls 808, 810. The upper surface 802 has a normal height H, and the first and second angled sidewalls 808, 810 are angled at angles $\theta_{s1}$, $\theta_{S2}$, respectively. As will be appreciated in more detail below, to determine height, H, and a sidewall angles $\theta_{s1}$, $\theta_{s2}$, three imaging operations are performed, and widths in the images are evaluated in light of the incident angles for the corresponding imaging operations.

As shown in the top portion of FIG. 8A, the table-like feature 800 is imaged when an focused beam of electrons (i.e., electron beam) 812 is scanned over the surface while kept at a normal angle (i.e., perpendicular to the upper surface 802). The electrons of the electron beam interact with atoms in the surface, producing signals that contain information about the sample's surface topography and composition. The most common mode of detection is by secondary electrons emitted by atoms excited by the electron beam. The number of secondary electrons is a function of the angle between the surface and the beam. On a flat surface, such as upper surface 802, the plume of secondary electrons is mostly contained by the surface (e.g., signal is detected with lower intensity), but on a tilted surface such as angled sidewalls, the plume is partially exposed and more electrons are emitted (e.g., signal is detected with higher intensity). By scanning the sample and detecting the secondary electrons, a first image 814 displaying the tilt of the three dimensional surface profile is created, such as shown in the lower portion of FIG. 8A. The widths of the various surfaces (e.g., $w_{bottom1}$, $w_{s1}$, $w_{top}$, $w_{s2}$, and $w_{bottom2}$) are then measured as seen from the normal view.

As shown in FIG. 8B, the three dimensional surface profile is re-imaged from a first oblique angle (e.g., $\theta_{i1}$=+30 degrees from normal), thereby producing a second image 816 as shown in the lower portion of FIG. 8B. Because of the oblique angle from which the surface profile is measured, the widths of the various surfaces change in the second image, relative to the first image. To determine the height H, the following expression can be evaluated:

$$\tan \theta_{i1} = (w_{s1'} - w_{s1})/H; \text{ or equivalently } H = (w_{s1'} - w_{s1})/\tan \theta_{i1}$$

where $\theta_{i1}$ is the first oblique angle, $w_{s1'}$ is the width of the first sidewall measured at the first oblique angle, and $w_{s1}$ is the width of the first sidewall measured at the normal angle. Once H is known, to determine the first sidewall angle $\theta_{s1}$, the following expression can be evaluated:

$$\tan \theta_{s1} = H/w_{s1}.$$

As shown in FIG. 8C, the three dimensional surface profile is re-imaged from a second oblique angle (e.g., $\theta_{i2}$=−30 degrees from normal), thereby producing a third image 818 as shown in the lower portion of FIG. 8C. Because of the second oblique angle from which the surface profile is measured, the widths of the various surfaces change in the third image, relative to the first image. To determine the height H, the following expression can be evaluated:

$$\tan \theta_{i2} = (w_{s2''} - w_{s2})/H; \text{ or equivalently } H = (w_{s2''} - w_{s2})/\tan \theta_{i2}$$

where $\theta_{i2}$ is the second oblique angle; $w_{s2''}$ is the width of the second sidewall measured at the second oblique angle $\theta_{i2}$; and $w_{s2}$ is the width of the second sidewall measured at the normal angle. Once H is known, to determine the second sidewall angle $\theta_{s2}$, the following expression can be evaluated:

$$\tan \theta_{s2} = H/w_{s2}.$$

Although FIGS. 8A-8C again illustrate a table-like feature 800 having an upper surface 802, which is substantially planar, and substantially planar angled sidewalls 808, 810 that support the upper surface over lower surfaces; it will be appreciated that this illustrated "table-like" feature is provided merely as an example, and any number of other features are contemplated as falling within the scope of this disclosure. For example, in other embodiments, the upper surface need not be substantially planar, but could be rounded or could come to a sharp point. Similarly, although the illustrated sidewalls are substantially planar, in other embodiments the sidewalls could be rounded. Further, although the sidewall angles $\theta_{s1}$, $\theta_{s2}$ are illustrated as being acute, these angles could also be right angles or even obtuse angles in other implementations. Also, although FIGS. 8A-8C only depicts the electron beam at oblique angles along a single axis (i.e., parallel to the plane of the page), it will be appreciated that the electron beam could also be provided along other axes (and/or multiple angles along one or more axes), such as previously described in FIGS. 6A-6C.

Figure 9A:
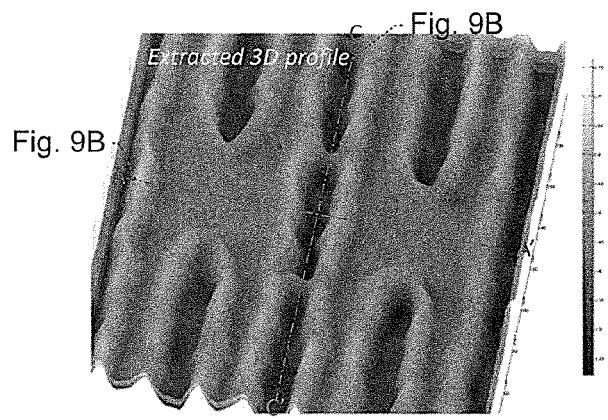
FIGS. 9A-9C show an example of a three-dimensional surface profile that includes photoresist scum.
Figure 9B:
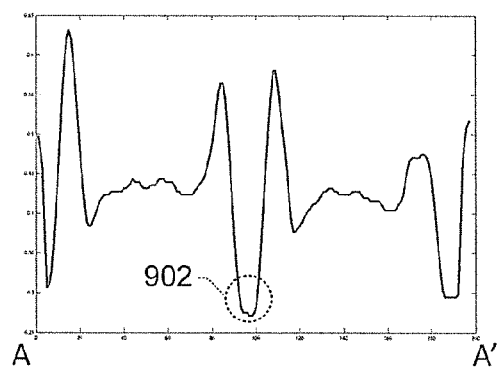
Figure 9C:
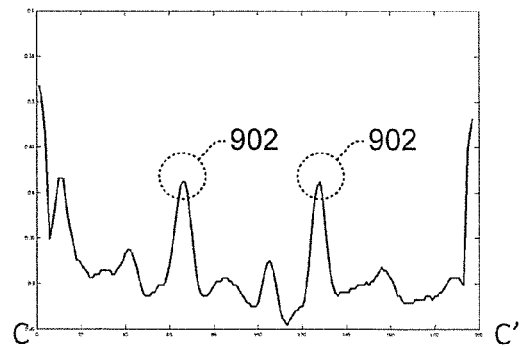

FIG. 9A-9C shows an example of a three-dimensional profile in accordance with some embodiments. The three-dimensional surface profile 900 is a photoresist profile over a workpiece, wherein the photoresist profile has raised bumps 902 in its surface near opposing outer edges or trenches of the workpiece. The raised bumps 902—which may be referred to as photoresist "scum" in some cases—can be an undesired artifact of the manufacturing and can lead to undesired lithography errors if not accounted for in lithography process models. Therefore, some aspects of this disclosure measure the profiles of this "scum" and then incorporate the scum profile into the subsequent photolithographic process model so that accurate simulations can be carried out to model real-world concerns.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein.

Further, it will be appreciated that "workpiece" as referred to herein may comprise any type of substrate, and typically is a semiconductor substrate such as a bulk silicon wafer, a diced substrate (e.g., integrated circuit), a binary compound substrate (e.g., GaAs wafer), a ternary compound substrate (e.g., AlGaAs), or higher order compound wafers, with or without additional insulating or conducting layers formed thereover, among others. When semiconductor substrates are used, they can also include non-semiconductor materials such as oxide in silicon-on-insulator (SOI), partial SOI substrate, polysilicon, insulator, oxide, metal, amorphous silicon, or organic material, among others. In some embodiments, the substrate can also include multiple wafers or dies which are stacked or otherwise adhered together. The substrate can include wafers which are cut from a silicon ingot, and/or any other type of semiconductor/non-semiconductor and/or deposited or grown (e.g. epitaxial) layers formed on an underlying substrate.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for characterizing a three-dimensional surface profile of a semiconductor workpiece, comprising;
    imaging the three-dimensional surface profile from a normal angle to provide a first image, the first image displaying widths for various surfaces in the three dimensional surface profile as seen from the normal angle;
    measuring the widths of the various surfaces in the first image;
    imaging the three-dimensional surface from a first oblique angle to provide a second image, the second image displaying altered widths for the various surfaces as seen from the first oblique angle; and
    based on differences between the widths in the first image and the altered widths in the second image, determining a feature height and sidewall angle for the three-dimensional profile.

2. The method of claim 1, further comprising:
    imaging the three-dimensional surface profile from a second oblique angle to provide a third image, the second oblique angle being different from the first oblique angle and the third image displaying further altered widths for the various surfaces as seen from the second oblique angle; and
    based on differences between the widths in the first image and the further altered widths in the third image, determining a second feature height and second sidewall angle for the three-dimensional profile.

3. The method of claim 2, wherein the first and second oblique angles are symmetrical about a plane on which the normal angle lies.

4. The method of claim 1, wherein the three-dimensional surface profile is a photoresist profile over the workpiece, wherein the photoresist profile has raised bumps in its surface near opposing outer edges of a feature or in a trench on the workpiece.

5. The method of claim 1, wherein imaging the three dimensional surface comprises directing an electron beam towards the three dimensional surface and measuring the intensity of secondary electrons emitted by excited atoms in the three-dimensional profile.

6. The method of claim 1, wherein the feature height is determined by taking a difference between a width of a first surface in the first image and an altered width of the first surface in the second image, and dividing the difference by a tangent of the first oblique angle.

7. The method of claim 6, wherein the sidewall angle is determined by dividing the feature height by the width of the first surface.

8. A method, comprising:
    providing a semiconductor workpiece with a three-dimensional surface profile, wherein the three dimensional surface profile includes a substantially planar surface, which has first and second edges, and a sidewall, which meets the planar surface at the second edge and which also includes a third edge, wherein the planar surface and sidewall meet at a to-be-determined angle other than ninety degrees at the second edge and wherein the sidewall has a normal height between the second and third edges;
    scanning an electron beam at a normal angle of incidence over the three dimensional surface profile and measuring an intensity of secondary electrons excited from the three dimensional surface to attain a first image;
    in the first image, measuring both a first width between the first and second edges and a second width between the second and third edges;
    scanning the electron beam at a first oblique angle of incidence over the three dimensional surface profile and measuring an intensity of secondary electrons excited from the three-dimensional surface to attain a second image;
    in the second image, measuring an altered first width between the first and second edges and an altered second width between the second and third edges; and
    based on the first and second widths and the altered first and second widths, determining the to-be-determined angle and the normal height.

9. The method of claim 8, further comprising:
    determining additional normal heights of additional respective sidewalls; and
    constructing a series of elevational contours based on the determined heights.

10. The method of claim 8, wherein the normal height is determined by solving the following expression: $H=(w_{s1'}-w_{s1})/\tan\theta_{i1}$, where $\theta_{i1}$ is the first oblique angle, $w_{s1'}$ is the width of the sidewall measured at the first oblique angle, and $w_{s1}$ is the width of the sidewall measured at the normal angle.

11. The method of claim 10, wherein the to-be-determined sidewall angle is that of the sidewall and is determined by the finding a value for $\theta_{s1}$ that fulfills the following expression: $\tan\theta_{s1}=H/w_{s1}$.

12. A method of evaluating a photolithography pattern, comprising:
    providing an electronic representation of a photolithography pattern to be imprinted on a semiconductor workpiece;
    determining through simulation how the photolithography pattern is expected to form a three-dimensional surface profile on the semiconductor workpiece;
    determining if the expected three-dimensional surface profile meets a predetermined fabrication standard; and
    based on whether the three-dimensional surface profile meets the predetermined fabrication standard, selectively revising the electronic representation of the photolithography pattern or imprinting the photolithography pattern on a semiconductor workpiece;
    wherein determining how the photolithography pattern is expected to form a three-dimensional surface profile comprises:
    providing an actual semiconductor workpiece having a three-dimensional surface profile thereon;
    imaging the three-dimensional surface profile from a normal angle to provide a first image, the first image displaying widths for various surfaces in the three dimensional surface profile as seen from the normal angle;
    measuring the widths of the various surfaces in the first image;
    imaging the three-dimensional surface from a first oblique angle to provide a second image, the second image displaying altered widths for the various surfaces as seen from the first oblique angle; and based on differences between the widths in the first image and the altered widths in the second image, determining a feature height and sidewall angle for the three-dimensional profile.

13. The method of claim 12, wherein the determined feature height and determined sidewall angle are used to determine through simulation how the photolithography pattern is expected to form a three-dimensional surface profile on the semiconductor workpiece.

14. The method of claim 12, wherein the feature height is determined by solving the following expression: $H=(w_{s1'}-w_{s1})/\tan\theta_{i1}$, where $\theta_{i1}$ is the first oblique angle, $w_{s1'}$ is the width of a sidewall measured at the first oblique angle, and $w_{s1}$ is the width of the first sidewall measured at the normal angle.

15. The method of claim 14, wherein the to-be-determined sidewall angle is that of the sidewall and is determined by the finding a value for $\theta_{s1}$ that fulfills the following expression: $\tan\theta_{s1}=H/w_{s1}$.

16. A method of evaluating a photolithography pattern, comprising:

providing an electronic representation of a photolithography pattern to be imprinted on a semiconductor workpiece;

determining through simulation how the photolithography pattern is expected to form a three-dimensional surface profile on the semiconductor workpiece;

determining if the expected three-dimensional surface profile meets a predetermined fabrication standard; and based on whether the three-dimensional surface profile meets the predetermined fabrication standard, selectively revising the electronic representation of the photolithography pattern or imprinting the photolithography pattern on a semiconductor workpiece;

wherein determining how the photolithography pattern is expected to form a three-dimensional surface profile comprises:

providing an actual semiconductor workpiece with the three-dimensional surface profile or another three-dimensional surface profile thereon, wherein the provided three dimensional surface profile includes a substantially planar surface, which has first and second edges, and a sidewall, which meets the planar surface at the second edge and which also includes a third edge, wherein the planar surface and sidewall meet at a to-be-determined angle other than ninety degrees at the second edge and wherein the sidewall has a normal height between the second and third edges;

scanning an electron beam at a normal angle of incidence over the provided three dimensional surface profile and measuring an intensity of secondary electrons excited from the provided three dimensional surface to attain a first image;

in the first image, measuring both a first width between the first and second edges and a second width between the second and third edges;

scanning the electron beam at a first oblique angle of incidence over the provided three dimensional surface profile and measuring an intensity of secondary electrons excited from the provided three-dimensional surface to attain a second image;

in the second image, measuring an altered first width between the first and second edges and an altered second width between the second and third edges; and based on the first and second widths and the altered first and second widths, determining the to-be-determined angle and the normal height.

17. The method of claim 16, wherein the determined feature height and determined sidewall angle are used to determine through simulation how the photolithography pattern is expected to form a three-dimensional surface profile on the semiconductor workpiece.

18. The method of claim 17, wherein the normal height is determined by solving the following expression: $H=(w_{s1'}-w_{s1})/\tan\theta_{i1}$; wherein H is the normal height, $\theta_{i1}$ is the first oblique angle, $w_{s1'}$ is the width of the first sidewall measured at the first oblique angle, and $w_{s1}$ is the width of the sidewall measured at the normal angle.

19. The method of claim 18, wherein the to-be-determined sidewall angle is that of first sidewall and is determined by finding a value for $\theta_{s1}$ that fulfills the following expression: $\tan\theta_{s1}=H/w_{s1}$.

* * * * *